(12) United States Patent
Caplet et al.

(10) Patent No.: US 9,063,410 B2
(45) Date of Patent: Jun. 23, 2015

(54) METHOD FOR MAKING MICRON OR SUBMICRON CAVITIES

(75) Inventors: Stéphane Caplet, Sassenage (FR); Claude Venin, Coublevie (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 127 days.

(21) Appl. No.: 13/108,663

(22) Filed: May 16, 2011

(65) Prior Publication Data

US 2011/0287370 A1 Nov. 24, 2011

Related U.S. Application Data

(63) Continuation of application No. 12/936,016, filed as application No. PCT/EP2009/053994 on Apr. 3, 2009, now abandoned.

(30) Foreign Application Priority Data

Apr. 4, 2008 (FR) ..................................... 08 52256

(51) Int. Cl.
*G03F 7/20* (2006.01)
*G03F 7/00* (2006.01)
(Continued)

(52) U.S. Cl.
CPC ............ *G03F 7/0007* (2013.01); *G03F 7/0005* (2013.01); *G02F 1/133377* (2013.01); *G03F 1/14* (2013.01); *G03F 7/2014* (2013.01)

(58) Field of Classification Search
CPC ... G03F 7/0005; G03F 7/0007; G03F 7/2014; G03F 1/14; G02F 1/133377

USPC .................................................. 430/320, 321
See application file for complete search history.

(56) References Cited

U.S. PATENT DOCUMENTS 3,863,249 A 1/1975 Olah
3,978,580 A 9/1976 Leupp et al.
(Continued)

FOREIGN PATENT DOCUMENTS

CH 591 090 9/1977
EP 0 782 037 A1 7/1997
(Continued)

OTHER PUBLICATIONS

Computer-generated translation of JP 11-149012 (Jun. 1999).*
(Continued)

*Primary Examiner* — John A McPherson
(74) *Attorney, Agent, or Firm* — Oblon, McClelland, Maier & Neustadt, L.L.P.

(57) ABSTRACT

A method for forming a micro-optical or sub-micro-optical device is provided, including: forming a photolithographic mask on a transparent support, depositing a layer of a photosensitive material of negative polarity on the face, a so called front face, of the support which supports the mask, wherein the mask is disposed under the areas where the photosensitive material should be removed, insolating the layer of the photosensitive material through the rear face of the support, developing the photosensitive material in order to obtain walls of micron or submicron cavities, removing the mask areas located at the bottom of the cavities in order to obtain cavities without any mask material between the walls, introducing a fluid into the cavities of the device, and forming a closure layer on the walls in photosensitive material.

12 Claims, 4 Drawing Sheets

Figure 1:
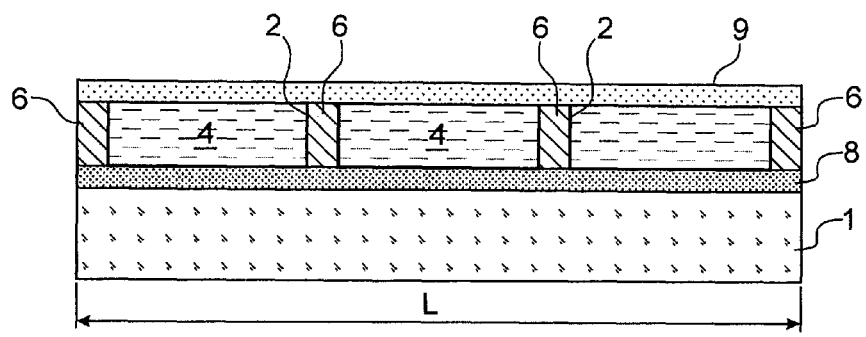

(51) Int. Cl.
*G03F 1/00* (2012.01)
*G02F 1/1333* (2006.01)

(56) References Cited

U.S. PATENT DOCUMENTS

| | | | |
|---|---|---|---|
| 4,989,226 | A | 1/1991 | Woodbury et al. |
| 5,417,801 | A | 5/1995 | Bol |
| 5,838,414 | A | 11/1998 | Lee |
| 6,063,653 | A | 5/2000 | Lin et al. |
| 6,947,202 | B2 | 9/2005 | Liang et al. |
| 6,958,207 | B1 | 10/2005 | Khusnatdinov et al. |
| 7,136,216 | B1 | 11/2006 | Daniel et al. |
| 2003/0076609 | A1 | 4/2003 | Kawase |
| 2003/0152849 | A1 | 8/2003 | Chan-Park et al. |
| 2004/0029303 | A1 | 2/2004 | Hart et al. |
| 2004/0161201 | A1 | 8/2004 | Souriau |
| 2004/0165252 | A1 | 8/2004 | Liang et al. |
| 2005/0275072 | A1 | 12/2005 | Haluzak et al. |
| 2006/0006336 | A1 | 1/2006 | Cano et al. |
| 2006/0275711 | A1 | 12/2006 | Fu et al. |
| 2007/0029277 | A1 | 2/2007 | Jacobowitz et al. |
| 2007/0087135 | A1* | 4/2007 | Hayashi ............ 428/1.3 |
| 2008/0037104 | A1 | 2/2008 | Hagood et al. |
| 2008/0088044 | A1 | 4/2008 | Cano et al. |
| 2008/0123045 | A1 | 5/2008 | Jeng et al. |
| 2008/0212017 | A1 | 9/2008 | Ballet et al. |
| 2008/0212023 | A1 | 9/2008 | Bovet et al. |
| 2009/0027767 | A1 | 1/2009 | Souriau et al. |
| 2009/0246546 | A1 | 10/2009 | Keppner et al. |
| 2009/0316110 | A1 | 12/2009 | Cano et al. |

FOREIGN PATENT DOCUMENTS

| | | | |
|---|---|---|---|
| EP | 0 977 076 | A2 | 2/2000 |
| EP | 1 672 394 | A1 | 6/2006 |
| EP | 1 722 424 | A1 | 11/2006 |
| EP | 1 791 197 | A2 | 5/2007 |
| FR | 2 872 589 | | 1/2006 |
| FR | 2 879 757 | | 6/2006 |
| FR | 2 888 948 | | 1/2007 |
| FR | 2 888 953 | | 1/2007 |
| FR | 2 897 164 | | 8/2007 |
| GB | 2 435 717 | A | 9/2007 |
| JP | 61-160788 | | 7/1986 |
| JP | 07-261016 | | 10/1995 |
| JP | 11-149012 | A * | 6/1999 |
| JP | 2000-221485 | | 8/2000 |
| JP | 2002-323630 | | 11/2002 |
| JP | 2006-163311 | A * | 6/2006 |
| WO | WO 99/45143 | | 9/1999 |
| WO | WO 02/065215 | A2 | 8/2002 |
| WO | WO 02/088671 | A1 | 11/2002 |
| WO | WO 03/021346 | A1 | 3/2003 |
| WO | WO 2006/052763 | A2 | 5/2006 |
| WO | WO 2006/067309 | A1 | 6/2006 |
| WO | WO 2006/067650 | A1 | 6/2006 |
| WO | WO 2006/116616 | A2 | 11/2006 |
| WO | WO 2007/090828 | A1 | 8/2007 |
| WO | WO 2007/141525 | A1 | 12/2007 |
| WO | WO 2010/003821 | A2 | 1/2010 |

OTHER PUBLICATIONS

Computer-generated translation of JP 2006-163311 (Jun. 2006).*
International Search Report issued Jun. 16, 2009 in Applcation No. PCT/EP2009/053994.
Preliminary Search Report issued Oct. 9, 2008 in France Application No. FA 705725 (With English translation of category of cited documents).
Chiung-Wen Kuo, et al., "Monolithic integration of well-ordered nanoporous structures in the microfluidic channels for bioseparation", Journal of Chromatography, 1162, 2007, pp. 175-179.
S. Cheylan, et al., "Optical study of polymer infiltration into porous Si based structures", Proceedings of SPIEE, vol. 6593, May 2007, pp. 65931K-1 to 65931K-11.
Nunc, "Tapes, Lids and Mats", Announcement Nunc International, Jan. 2006, 4 pages.
M. Trejo-Valdez, et al., "Aerosol-gel deposition of photocurable ORMOSIL films doped with a terbium complex", Optical Materials, 25, 2004, pp. 179-184.
Y. Nishijima, et al., "Inverse silica opal photonic crystals for optical sensing applications", Optics Express, vol. 15, No. 20, 2007, pp. 12979-12988.
San Ming Yang, et al., "Opal Circuits of Light—Planarized Microphotonic Crystal Chips", Advanced Functional Materials, vol. 12, 2002, pp. 425-431.
Matthieu Liger, et al., "Robust Parylene-to-Silicon Mechanical Anchoring", MEMS-03, IEEE, Micro Electro Mechanical Systems, The Sixteenth Annual International Conference, Jan. 19-23, 2003, pp. 602-605.
Office Action issued Sep. 3, 2013, in Japanese Patent Application No. 2011-502390.
Office Action issued May 7, 2014 in Japanese Patent Application No. 2011-502390 (with English language translation).

* cited by examiner

METHOD FOR MAKING MICRON OR SUBMICRON CAVITIES

CROSS REFERENCE TO RELATED APPLICATION

The present application is a continuation of U.S. application Ser. No. 12/936,016, filed on Oct. 1, 2010, which was the National Stage of International Application No. PCT/EP09/053,994, filed on Apr. 3, 2009, which claimed priority to French Application No. 0852256, filed on Apr. 4, 2008. Application Ser. No. 12/936,016 in hereby incorporated by reference in its entirety.

DESCRIPTION

Technical Field and Prior Art

The invention relates to the making of devices containing cavities of micron or even submicron dimensions delimited by walls, into which a material such as a functional fluid may be introduced. A particular application notably relates to <<optical>> devices for which the functional fluid has specific optical properties.

An example of such a optical element is illustrated in FIG. 1. It has a width L which may for example range up to 100 mm or more.

It includes a network of independent micropits or microcavities 2, separated by walls 6. These microcavities are structured on a substantially planar support.

They may then be filled with suitable liquid(s) 4 for the sought optical effect.

Depending on the applications, the cavities may be closed by a closure layer 9 in a preferably flexible material, generally adhesively bonded on the tops of the walls 6.

The assembly is formed on a support including in the illustrated example, a substrate 1 in a material such as quartz and a layer 8 in polymeric material.

Such an optical element may contain a certain number of micropits which may be of the order of a few tens of thousands or even a few hundred thousands and more.

For optical applications the walls 6 should be as less visible as possible, which imposes a large aspect ratio (or form factor), with small wall widths for a significant height in the desired range for example from 2 to 100 µm.

The walls, and the microcavities may be obtained by a collective microtechnology type method, or by anisotropic etching of a resin selected for its structural properties.

With the so-called <<embossing>> or molding technique it is possible to achieve sought form factors in a very competitive way, economically, since it is a direct operation.

However, it has the drawback of being very limiting on the structure of the well bottom since in principle it leaves the same polymer as the walls, unless the thickness of the molded film is controlled very accurately, which remains very difficult.

Another method is photolithography of a photoresist. A photoresist is deposited with the desired thickness and is insolated with UV light in order to define the walls.

In order to obtain good resolution with this technique, expensive photolithographic equipment has to be used. Nevertheless, the latter do not have the field depth required for making walls with a large aspect ratio. This entails the necessity of using even more sophisticated techniques, further adding to the manufacturing cost.

Two problems are to be solved in this approach:
the high investment cost for applying such a technique; it requires an optical machine which, taking into account the sought resolution, should be of the <<stepper>> type. The substrate is insolated in the <<step & repeat>> mode: a mask at the scale of the optical element is insolated and there is then movement of the substrate in order to insolate the next area. The result is slowed-down productivity all the more so since the photoresist is thick, may be made opaque in visible light by adding a black dye and may therefore require long insolation time,
the loss of resolution related to the thickness of the resin. Indeed, with optics installed in the optical machines used a resolution of 2 µm (as a grating) may be obtained, but on resins with a thickness from 1 to 1.2 µm. Now, the walls of the micropits may have a height above 10 µm, the result is a loss of resolution which may preclude lines with a size of less than 4 µm, therefore acting as a brake on the development of micropits towards increasingly finer sizes.

There is therefore a problem of finding a suitable compromise between productivity and form factor.

Finally, another technique using direct transfer onto the front face of the support, of walls formed beforehand is difficult to apply, since the contact between the walls and the support is very delicate.

The problem is therefore posed of finding a method which gets rid of these problems and allows work on a large thickness range of photosensitive material while not sacrificing the resolution and while allowing good productivity.

According to another aspect, the problem is posed of achieving smaller form factors than those obtained with standard photolithographic techniques.

DISCUSSION OF THE INVENTION

The invention mainly relates to a method for forming walls of cavities, for forming an optical or micro-optical (micron or submicron) device, including:
  forming a photolithographic mask on a transparent support,
  depositing a layer of photosensitive material on the face, the so-called front face, of the support which supports the mask,
  insolating the photosensitive material through the rear face of the support,
  developing the photosensitive material in order to obtain said walls.

The photosensitive material may be of negative polarity, in which case the opaque portions of the mask are formed under the areas where the photosensitive material should be removed.

In the case of an optical application, when the photosensitive material is of negative polarity, the areas of the mask located at the bottom of the cavities are also removed after removing said material in these same cavities.

Alternatively, the photosensitive material may be of positive polarity, and the opaque portions of the mask are formed under the areas where the photosensitive material should be preserved.

With the invention it is possible to produce in a very large number, cavities of microcavities, the walls of which have very variable form factors and with photosensitive materials of any polarity, either loaded with dyes or not. It also gives the possibility of keeping great latitude in the selection of optional sublayers belonging to the support. The cavities or microcavities may be intended to contain a fluid or a liquid.

Thus, depending on the contemplated applications, the support may include at least one sublayer in contact with the functional fluid introduced into the cavities and with the base of the walls. This sublayer may be selected for its mechanical properties (for example adherence) and/or electric properties and/or surface properties (for example following a suitable surface treatment such as rubbing and/or a hydrophilic treatment or a hydrophobic treatment).

Thus, as an example, it is possible to mention as a material used for forming:

an adherence sublayer: $SiO_2$,
an electrical actuation sublayer (electrode): ITO or $WO_3$,
an alignment sublayer: rubbed polyimide.

Each of these sublayers may be used alone or as a combination with one or several others of these same sublayers and positioned between the mask and the support.

For optical applications, a transparent substrate will advantageously be selected such as quartz, plastic such as PET (polyethylene terephthalate). ITO, $SiO_2$ or polyimide sublayers are transparent for these same optical applications. A device is therefore obtained, in which there is transparence for radiations which pass through the substrate substantially perpendicularly to the latter, or which pass through or will pass through the cavity delimited by the walls formed. In particular, there is not any mask portion present in the bottom of the cavities. The range of radiation for which there is transparence is preferably comprised between 260 nm and 450 nm.

Thus, the support may include a simple substrate, or a substrate and one or more of the additional sublayers above.

The invention applies photolithographic means, which may easily be integrated in a collective embodiment on a same production line.

The photolithographic mask is preferably an UV-absorbent material and which may be removed, for example in a non-aggressive chemical way. For example it is in chromium or in Ti, and for example with a thickness of about a few hundreds nm, for example further about 100 nm.

The walls of the obtained cavities have a thickness which may be comprised between 2 μm and 100 μm and a width which may be comprised between 10 μm and 0.5 μm.

The photosensitive material may be a resin (deposited as a liquid and then polymerized) or a dry film (deposited by lamination for example).

The photosensitive material may be blackened by adding a dye.

The invention also relates to a method for forming a device, used for forming an optical or micro-optical (micron or sub-micron) device, including:

the formation of the walls of cavities of this device, including the application of a method as discussed above,
the introduction of a fluid into the cavities of the device,
the formation of a closure layer on the walls in photosensitive material.

In the case of collective production, an individualization of the final product may be carried out.

SHORT DESCRIPTION OF THE DRAWINGS

Figure 2A:
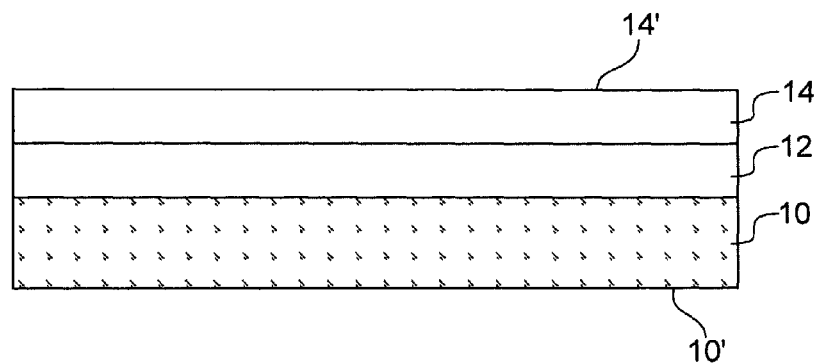
Figure 2B:
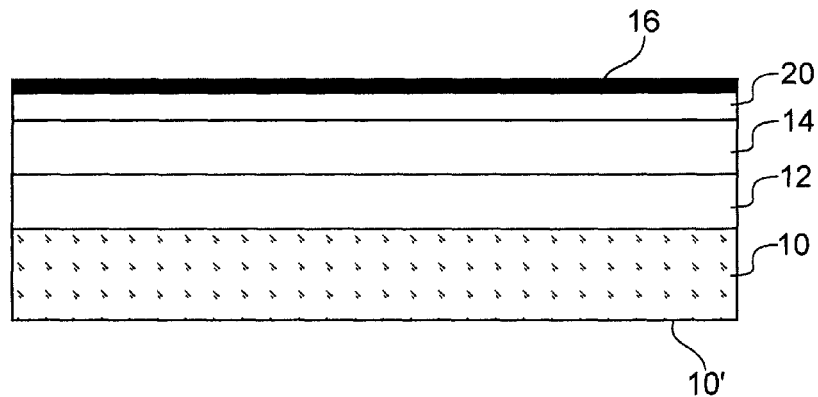
Figure 2C:
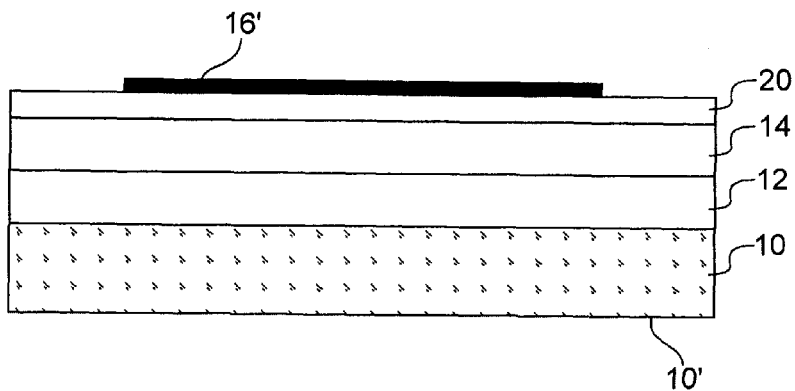
Figure 2D:
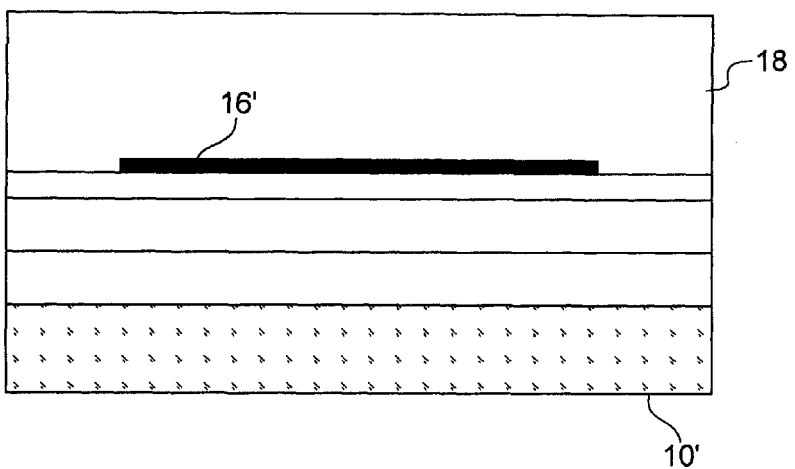
Figure 2E:
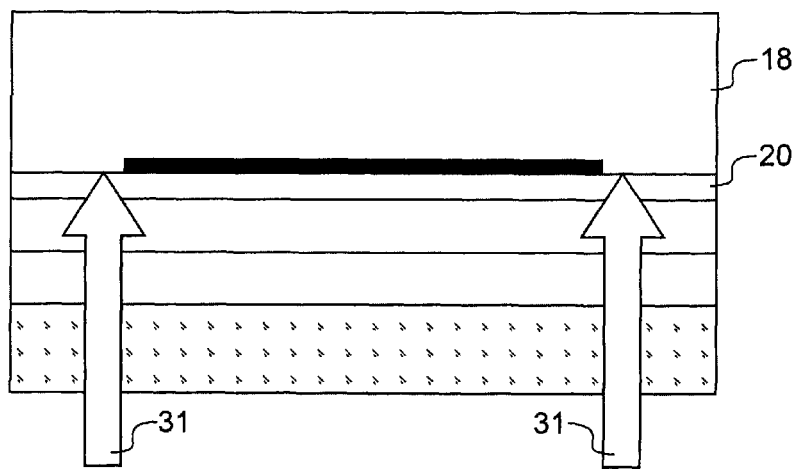

FIG. 1 illustrates a known cavity structure.
FIGS. 2A-2F illustrate steps for carrying a method according to the invention.
FIGS. 3A-3C illustrate certain steps for carrying out another method according to the invention.

Figure 4:
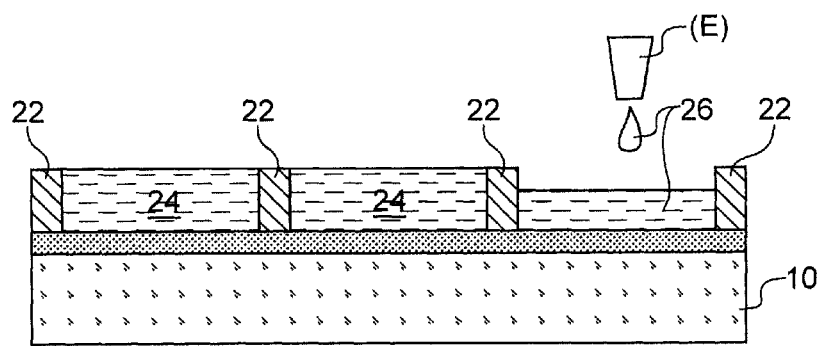

FIG. 4 illustrates an operation for filling cavities with a liquid.

DETAILED DISCUSSION OF PARTICULAR EMBODIMENTS

An embodiment of the invention will be described in connection with FIGS. 2A-2F.

A support is first formed, which may consist in a simple substrate 10, for example in a polymeric material such as PET.

Alternatively, on the surface of this same substrate 10, one or more transparent films 12, 14, may be deposited in a thin layer. These films deposited as a thin layer are for example an ITO film 12 with a thickness of a few hundred nm and a polyimide film 14 (alignment layer) with a thickness comprised between 30 nm and 100 nm of thickness, either rubbed or not at this stage depending on the targeted application.

The assembly forms a support transparent to UV radiations.

The substrate 10 and the optional layers 12, 14 are preferably transparent in at least the spectral range from 260 nm to 450 nm.

Conventionally, the in principle free face, 14' on the stacking side 12, 14, is the so-called <<front face>> of the support. If there is no stacking 12, 14 but only one substrate 10, any one of the faces is said to be a front face. The other face 10' is a so-called <<rear face>>.

Next (FIG. 2B) a metal layer 16 for example a chromium layer with a thickness of 50 nm, is deposited. A metal different from chromium may be used. Any metal may be used or even any material which is absorbent to UV (typically in the spectral range comprised between 305 nm and 460 nm) and which may be selectively removed with regard to the support, to the resin and to the possible friction and/or adherence sublayers, and/or other sublayers. Preferably, removal occurs by a chemical technique. For example, a titanium layer may be used, which may then be etched with HF.

An adherence layer 20, for example in $SiO_2$ may optionally be formed, before depositing the layer 16. This layer 20 will allow reinforcement of the adherence of the future resin 18 on the support. The layer 20 is itself also transparent, in the same range of wavelengths as the other elements (260 nm-450 nm).

The masking layer (for example in metal) 16 may then be structured, for example etched in order to delimit the future shape of the microcavities. For this purpose, a photosensitive material, for example a photolithographic resin, is deposited on the layer 16. The latter is insolated through a suitable mask reproducing the shape of the patterns (in fact: the shape of the walls of the micropits) which one wishes to produce later on. This photolithographic resin is developed, and then the material of the layer 16 is etched with an acid bath (for example etching of a titanium layer 16 with 0.3% HF); the non-insolated resin which protects the material of the layer 16 where it is desirably kept, is then removed. A mask 16' is therefore obtained (FIG. 2C).

During the next step (FIG. 2D), a thick photosensitive resin 18 (thickness comprised between 2 and 100 μm) with negative polarity is deposited, in which the walls of the micropits will be made. Insolation of this resin 18 is performed through the rear face 10', through apertures made in the UV masking layer 16. These walls will be formed with the mask made earlier which, for insolation from the rear face 10', protects the areas where removal of the resin is subsequently desired.

Next (FIG. 2E), it is proceeded with UV insolation 31 through the rear face 10' of the support. The areas of the resin which are insolated are then polymerized and will form the walls.

Preferably, insolation is achieved in a single flash or scan, over the whole surface of the substrate. The UV source may be of very high energy.

The resin is then passed in a developer which will allow removal of the non-insolated portions. This operation does not damage the optional polymeric layer 14 which, at this location, is protected by the masking layer. By removing the UV masking layer 14 by chemical etching, it is possible to again find the surface of the support (here: the surface of the polymer 14) which was able to be rubbed prior to depositing the mask and the alignment layer.

Figure 2F:
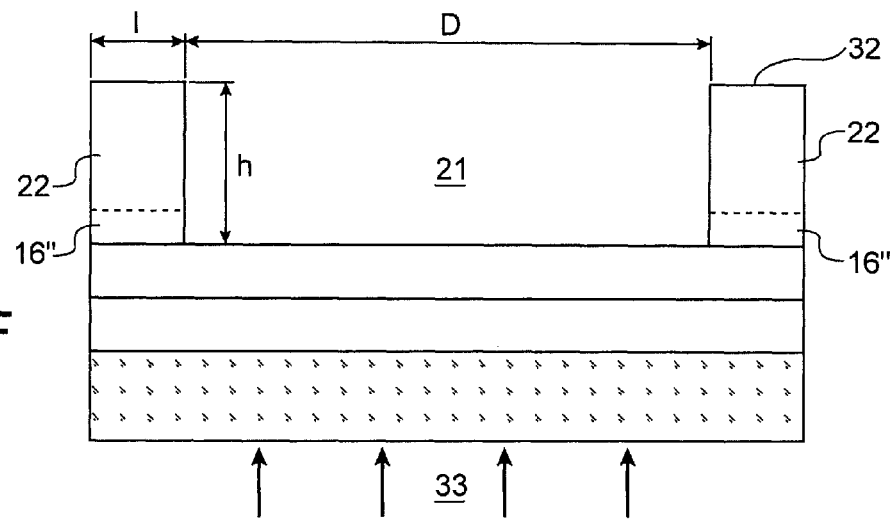
Figure 3A:
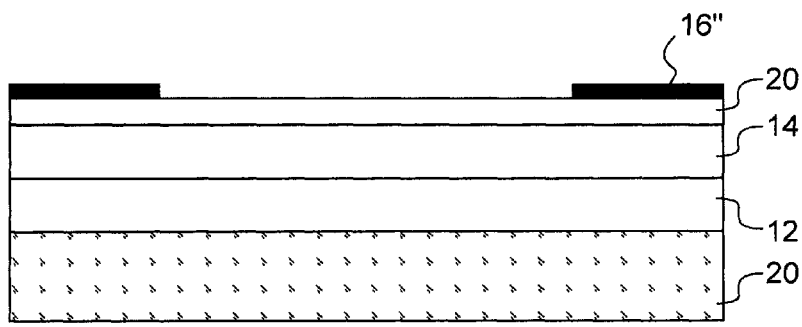
Figure 3B:
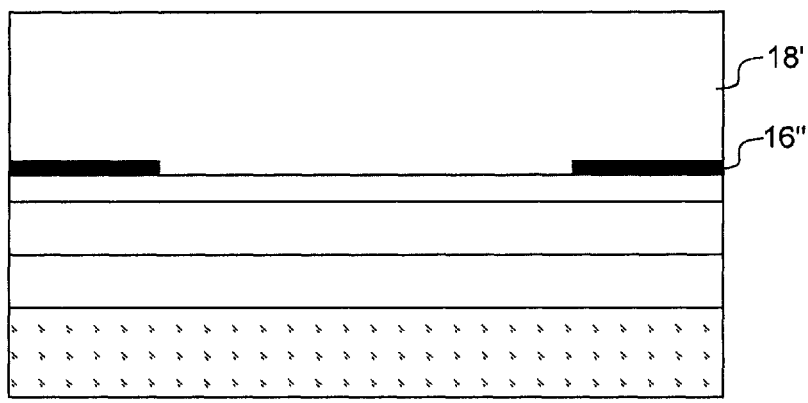
Figure 3C:
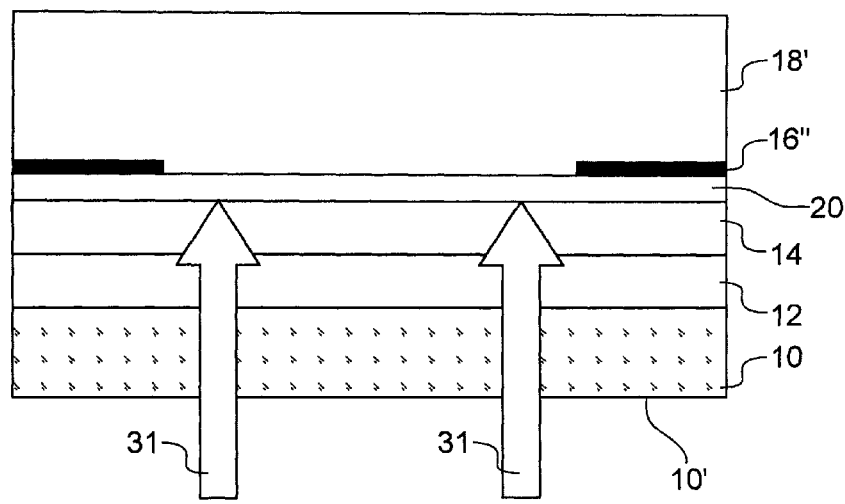

A structure is obtained including the initial support, the optional sublayer(s) and the walls 22 with a top 32, which delimit cavities 21 (FIG. 2F). Only one of these cavities is illustrated in FIG. 2F, but the method may be collective and allows several cavities to be made, and even in a very large number.

The height h of the walls 22 which delimit each cavity 21 is typically of the order of a few μm or of several tens of μm, for example 20 μm and comprised between 2 μm and 100 μm. The width l of each wall may be comprised between 0.5 μm and 10 μm. The form factor is determined as the ratio of height to width (height/width ratio), it may for example be comprised between 3 and 10. This cavity 21 may have a width or an average diameter D comprised between 10 μm and 500 μm.

In FIG. 2F it is seen that radiation 33 may pass through the substrate substantially perpendicularly to the latter. In particular, there is no mask portion or of any other material, present in the bottom of the cavities or in the stack of the layers 12, 14 and of the substrate 2, and which would interfere with the propagation of this radiation.

Another embodiment of the invention will be described in connection to FIGS. 3A-3C.

The operations apply the same materials as in the previous embodiment, except for the resin 18' (FIG. 3B) which, this time, is a positive resin.

The steps are therefore substantially the same as earlier, except for making the mask: the mask material is removed by etching, there where it is desired to remove the future photolithographic resin 18' with positive polarity (FIG. 3A).

Next after formation of the mask (FIG. 3B), this resin 18' of positive polarity is deposited, in which, there again, the walls of the micropits will be made.

Next, (FIG. 3C), it is proceeded with UV insolation 31, through the rear face 10' of the support. The areas of the resin which are insolated are then polymerized. There again preferably, insolation is performed in a single flash over the whole surface of the substrate. The UV source may be of very high energy.

The resin is then passed in a developer which will allow removal of the insolated portions. Reference will be made to the remarks already made above for this step.

In this embodiment, the mask 16" is again found under the resin wall which is preserved and may for example play the role of a contrast mask (<<black matrix>>) or allow electric actuation (for example the case of an ITO or WO3 mask).

There again, the structure of FIG. 2F is obtained, including the initial support and the walls 22, with the notably geometrical features already described above. Further, the mask areas 16" are located under the walls 22, but not between the walls, in the areas forming the actual cavity. There again, there is no mask portion or of any other material, present in the bottom of the cavity or in the stack of the layers 12, 14 and of the substrate 2, and which would interfere with the propagation of the radiation 33.

Regardless of the embodiment, the thick resin 18, 18' of positive or negative polarity may be blackened by adding a dye. The exposure time then increases but is still acceptable, in this approach where a single exposure on the rear face is achieved.

The thereby formed microcavities have the goal of retaining a fluid such as a liquid or liquids which may be different from one cavity to the other, in order to achieve a spatially defined optical function.

A liquid may be a mixture of liquid crystals, a photosensitive liquid, or any other functional liquid or with an index which allows control and modification of the path or of the intensity of the light rays which will pass through the device made.

In the case of liquids different from one cavity to another, these liquids may be obtained from the mixture of two or several liquids or else from liquids which are all different. These liquids are delivered by any technique adapted to localization of small volumes, i.e. a few tens to hundreds of picoliters.

Notably, the filling of one or more cavities may be carried out with a piece of equipment E (FIG. 4) targeting the interior of the cavities 21 and projecting the liquid material 24 as a jet or as drops 26, with a volume which may be of the order of several picoliters. The liquid may be delivered by means of a technique suitable for localization of small volumes, i.e. a few tens to hundreds of picoliters. The piece of equipment E used may apply a liquid dispensing technique similar to that of dispensing via an ink jet.

The liquid material 24 may fill the cavities 21 either partly or completely. A total filling of the cavities may be carried out so as to attain the top 32 of the walls 22.

The product is finished by forming, for example by lamination, a protective plastic film 9 (FIG. 1). This film may be covered with functional layers suitable for the final function (anti-reflection coatings, hard layers, dirt-repellent coatings, . . . ).

According to one possibility, for certain applications, for example for making individual optical lenses, a separation of the sealed cavities 21 from each other or of groups of sealed cavities, may be carried out. The closed enclosures filled with liquid are thus dissociated or individualized.

Such a separation may be accomplished for example by a laser, or by means of ultrasonic waves or by means of at least one cutting tool, on the rigid support 10 having been used for making the device.

The separation is achieved after having ensured sealing of the periphery of the cavities 21. This separation may be accompanied by peripheral sealing which ensures imperviousness to gases and humidity and good mechanical strength over the life time of the product.

The invention claimed is:
1. A method for forming a micro-optical or sub-micro-optical device, comprising:
forming a photolithographic mask on a transparent support,
depositing a layer of a photosensitive material of negative polarity on the face, a so called front face, of the support which supports the mask,
wherein the mask is disposed under the areas where the photosensitive material should be removed,
insolating the layer of the photosensitive material through the rear face of the support, developing the photosensitive material in order to obtain walls of micron or submicron cavities, removing the mask areas located at the bottom of the cavities in order to obtain cavities without any mask material between the walls, introducing a fluid into the cavities of the device, and forming a closure layer on the walls in photosensitive material.

2. The method according to claim 1, further including forming at least one sublayer between the mask and the support.

3. The method according to claim 2, said at least one sublayer having mechanical and/or electrical and/or surface properties.

4. The method according to claim 2, wherein the at least one sublayer has surface properties and is in polyimide.

5. The method according to claim 2, wherein the at least one sublayer has electrical properties and comprises ITO or WO3.

6. The method according to claim 2, wherein the at least one sublayer has mechanical properties and comprises $SiO_2$.

7. The method according to claim 6, wherein the mask comprises chromium or titanium.

8. The method according to claim 1, wherein the photolithographic mask comprises UV-absorbent material and may be removed chemically.

9. The method according to claim 1, wherein the walls have a thickness of more than 2 μm.

10. The method according to claim 1, wherein the walls have a width of less than 10 μm or comprised between 10 μm and 0.5 μm.

11. The method according to claim 1, wherein the photosensitive material is blackened by adding a dye.

12. The method according to claim 1, wherein the support comprises a transparent substrate comprising quartz or plastic.

* * * * *